United States Patent [19]

Cowans et al.

[11] Patent Number: 4,622,660
[45] Date of Patent: Nov. 11, 1986

[54] SYSTEMS AND METHODS FOR SIGNAL COMPENSATION

[76] Inventors: Kenneth W. Cowans, 17520 Greenleaf St., Encino, Calif. 91316; M. Owen Bennett, 5913 Etiwanda Ave. #7, Tarzana, Calif. 91356

[21] Appl. No.: 808,211

[22] Filed: Dec. 10, 1985

Related U.S. Application Data

[63] Continuation of Ser. No. 467,434, Feb. 17, 1983, abandoned, which is a continuation-in-part of Ser. No. 435,778, Oct. 21, 1982, abandoned.

[51] Int. Cl.$^4$ .............................................. G11B 3/00
[52] U.S. Cl. ..................................... 369/134; 328/165; 369/53; 369/174; 381/94
[58] Field of Search ................. 369/53, 54, 55, 107, 369/133, 134, 146, 147, 148, 174; 358/335, 342, 36, 327, 167; 328/165, 167; 381/71, 94, 93, 120, 121

[56] References Cited

U.S. PATENT DOCUMENTS

| | | | |
|---|---|---|---|
| 2,218,399 | 10/1940 | Le Bel | 369/133 |
| 2,657,276 | 10/1953 | Eliot et al. | 369/174 |
| 2,835,735 | 5/1958 | Moen | 381/71 |
| 4,223,242 | 9/1980 | Redlich et al. | 369/133 |
| 4,309,722 | 1/1982 | Palmer | 358/342 |

FOREIGN PATENT DOCUMENTS

| | | | |
|---|---|---|---|
| 55-64655 | 5/1980 | Japan | 369/54 |
| 55-64498 | 5/1980 | Japan | 369/134 |
| 1500002 | 2/1978 | United Kingdom | 381/71 |
| 474904 | 11/1975 | U.S.S.R. | 330/149 |

OTHER PUBLICATIONS

Ahmed M. Soliman et al, "Active Compensation of Opamps", *IEEE Trans. on Circuits and Systems*, vol. CAS-26, No. 2, (Feb. 1979), pp. 112–117.

*Primary Examiner*—Donald McElheny, Jr.
*Attorney, Agent, or Firm*—Bogucki, Scherlacher, Mok & Roth

[57] ABSTRACT

A method for correcting higher order distortion introduced in a complex multifrequency waveform by an element which introduces signal-induced nonlinearities uses a replica of the non-linear element as a part of a high gain electronic feedback circuit between the output and an input of an amplifier. The replica of the non-linear element receives the multifrequency waveform, and is driven to duplicate the non-linear effects, which are used to generate a compensating voltage which is compared to the voltage obtained from the non-linear device. The resultant difference voltage after the comparison and amplification is then closer to the original signal. Thus, in an audio system for example, distortions which are audibly apparent to the human ear but so small they are immeasurable by instrumentation can be eliminated or minimized by employing a number of replicas in the same fashion. In corollary fashion a signal that is to be processed by circuits containing non-linear elements or devices can be precompensated prior to processing.

30 Claims, 17 Drawing Figures

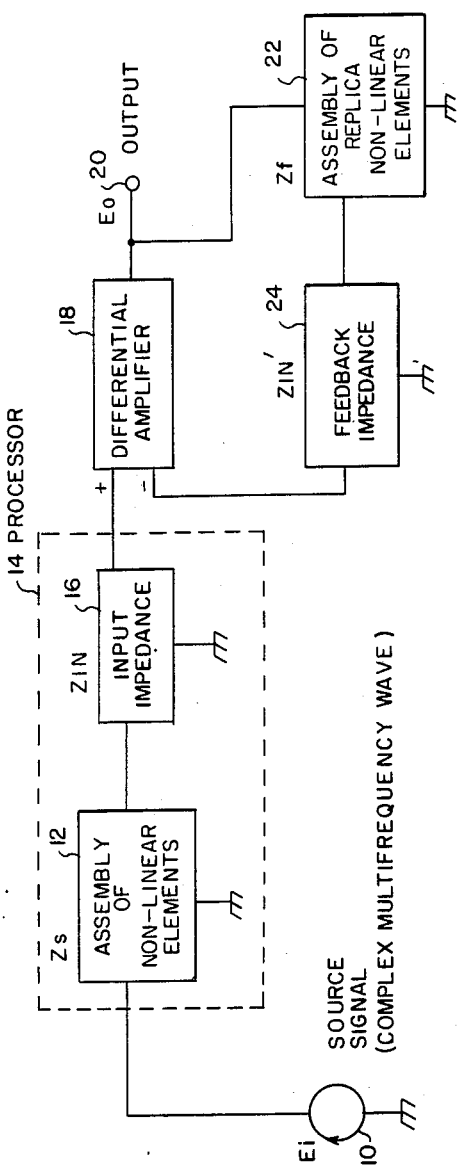
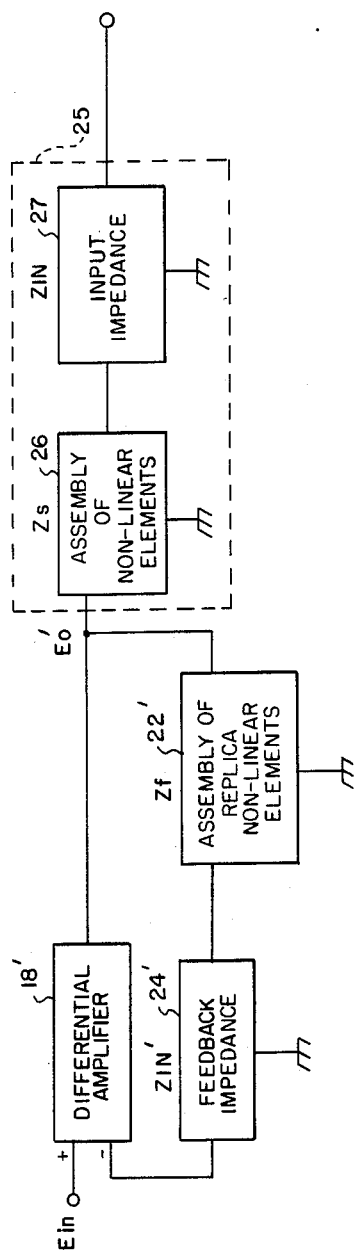

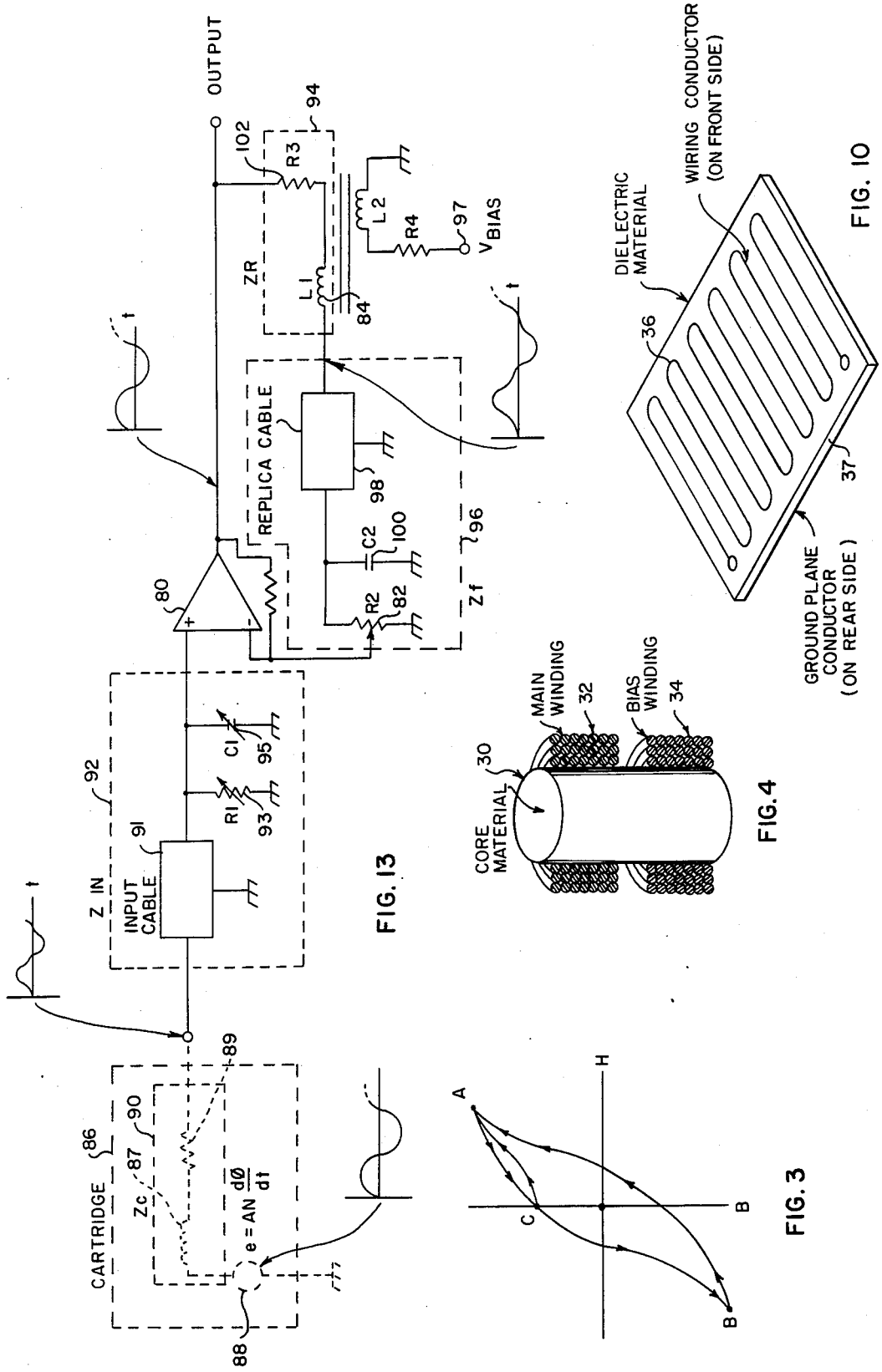

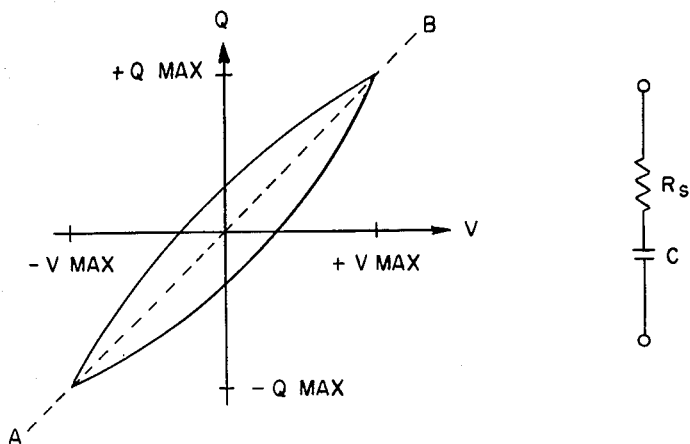
FIG. 5        FIG. 6
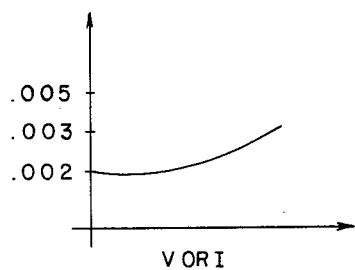
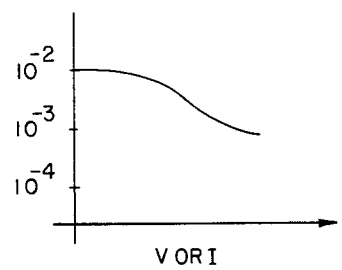
FIG. 7        FIG. 8
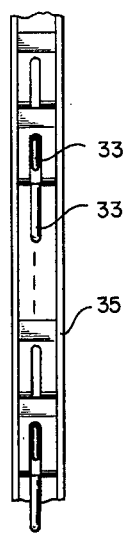
FIG. 9

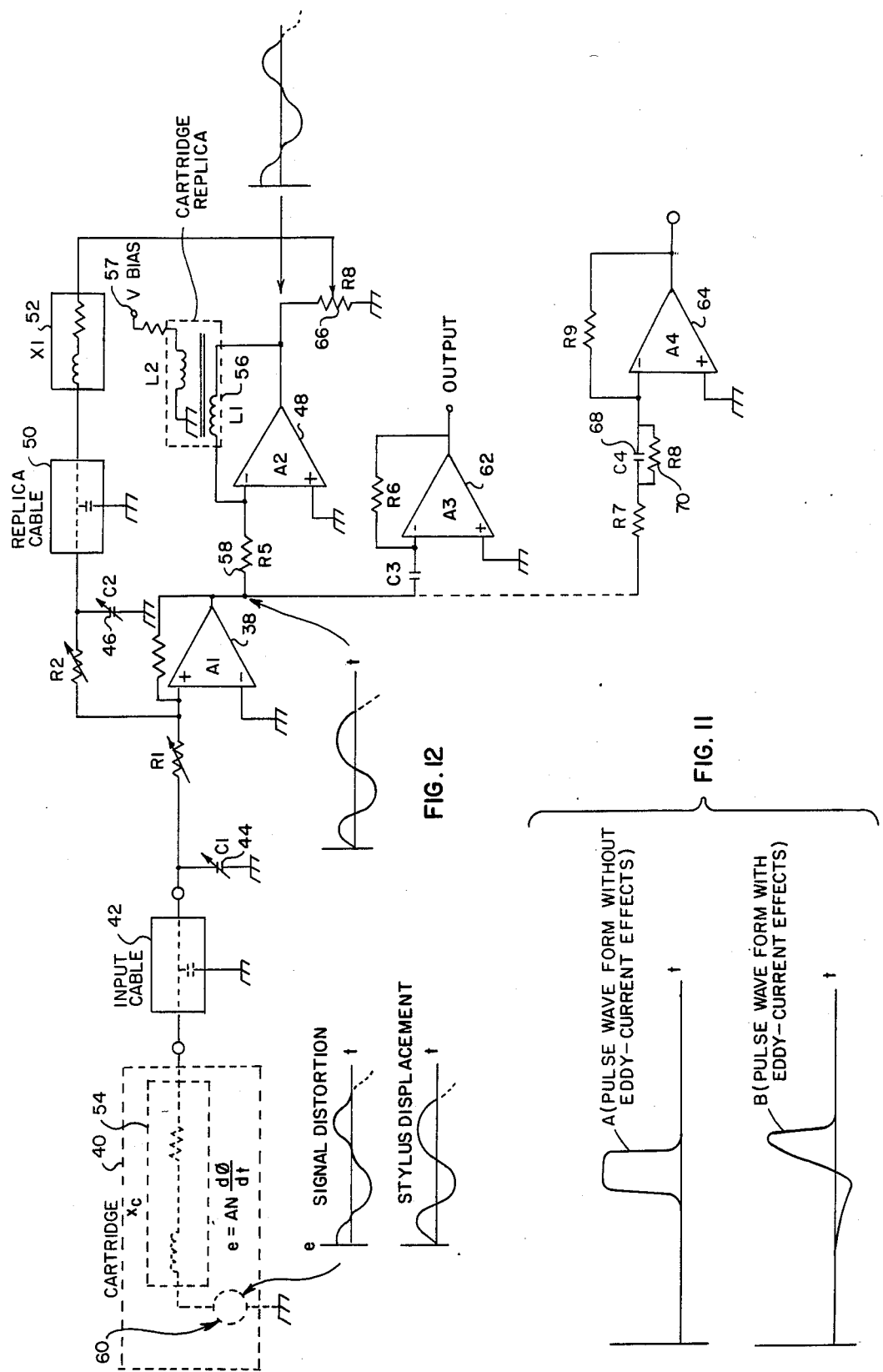

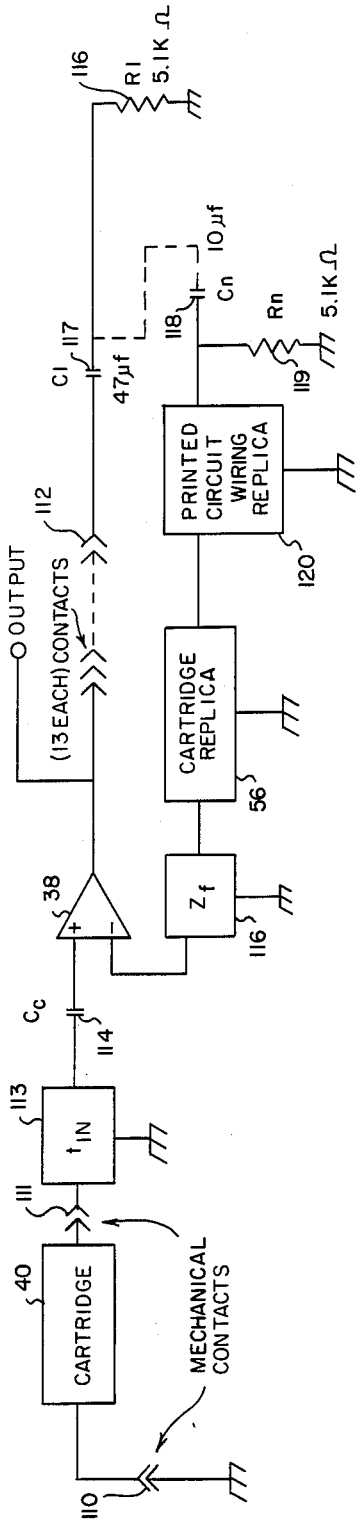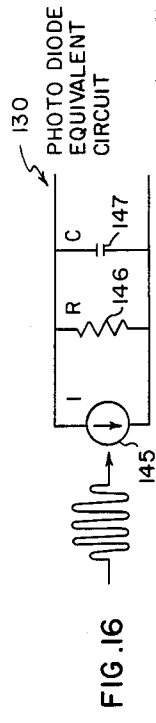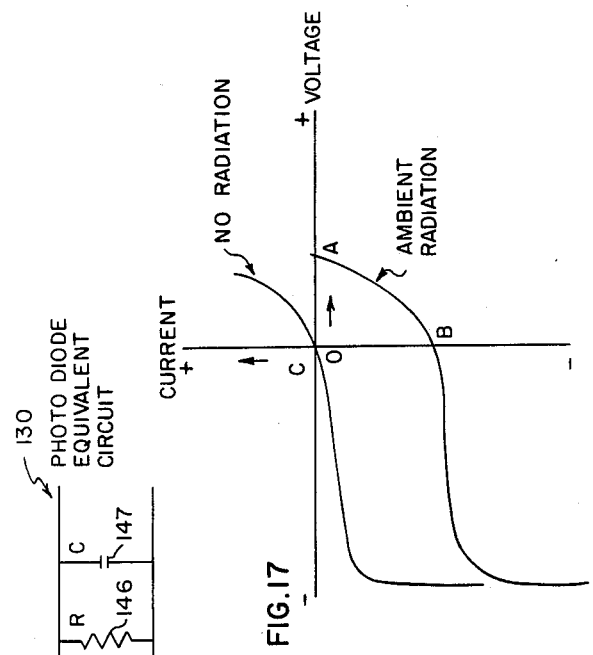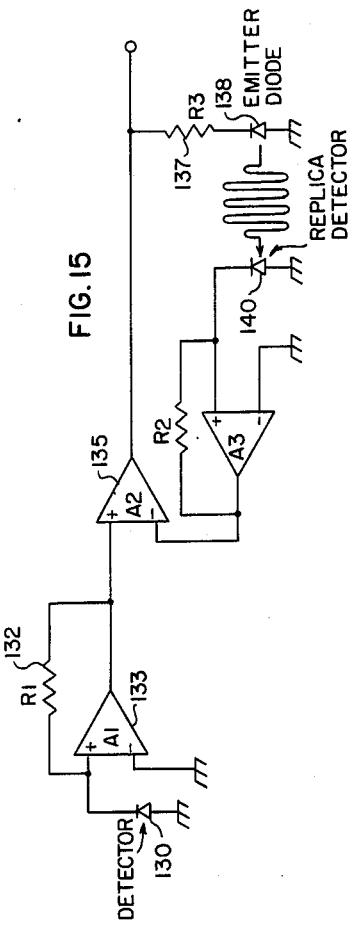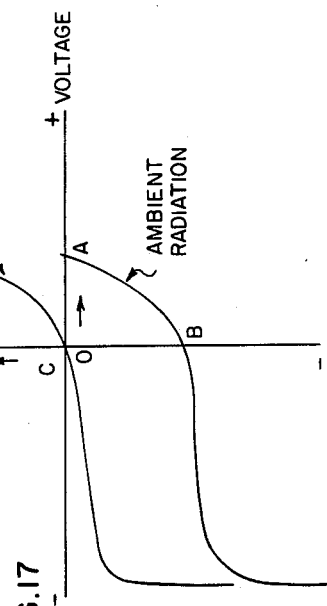
FIG.14
FIG.15
FIG.16
FIG.17

SYSTEMS AND METHODS FOR SIGNAL COMPENSATION

CROSS REFERENCE TO RELATED APPLICATION

This is a continuation of co-pending application Ser. No. 467,434 filed on Feb. 17, 1983 now abandoned, which is a continuation-in-part of application Ser. No. 435,778, filed Oct. 21, 1982, abandoned, for "Compensated Magnetic Phonograph Transducer" by Kenneth W. Cowans and M. Owen Bennett.

BACKGROUND OF THE INVENTION

This invention relates to systems and methods for reproducing true or idealized signal waveforms despite the presence of inconstant and virtually unmeasurable deviations arising from internal components, and more particularly to systems and methods for reproducing sound with fidelity.

Modern electronic systems utilize a great number of compensation techniques for improving the linearity or sensitivity of a circuit, such as feedback circuits, passive networks and active networks. It is common practice to arrange discrete elements, or the equivalent in integrated circuit elements, so as to provide a desired compensation where the disturbing effect is measurable. Where the disturbing effect is not measurable but is somehow evidenced in the output, the solution has usually been to choose materials or components that exhibit the least disturbing effect under these conditions.

Applicants have worked extensively in the field of high fidelity sound reproduction, and in the elimination of spurious emanations in reproduced sound, as evidenced by U.S. Pat. No. 4,340,778 entitled "Acoustic Systems". Minimization of these spurious emanations has enabled identification of other disturbing factors, particularly with audio systems and components of good design. It became evident that numerous influences are at play in an audio system, and that these influences are inconstant in nature and are derived from internal operative factors that have heretofore been accepted as necessary limitations on performance, given the need for reasonable system economy. The inconstant deviations of sound are perceptible to the human ear because of the great capabilities and subtlety of that instrument, even though typical measuring instruments cannot quantify effects which are several orders of magnitude less than the dominant signal, and which vary dynamically in accordance with a complex multi-frequency wave.

Applicants first confronted this problem in terms of the disparity in performance between a magnetic phonograph cartridge of the moving magnet or moving iron type, in contrast to the substantially more expensive (and difficult to replace) moving coil type of phonograph cartridge. It was deduced that hysteresis effects in the magnetic circuit might be the cause of the inconstant perturbations, although of the many magnetic circuits and devices now in use there are no known suggestions for cancellation of hysteresis effects. Instead, the typical approach appears to have been to attempt to utilize materials having minimum hysteresis loss, where this has been recognized as a problem. Similarly, there has been recognition in the audio field that the quality of reproduced sound is recognizably affected by the nature of the input cable connection, but the primary solutions known have merely been to utilize higher cost cables with superior conductivity (e.g., better shielding and gold-plated contacts). Applicants have found, however, that there are a number of similar disturbing factors of what may be regarded as a hysteretic character, in that they are time variant in nature and signal amplitude dependent and are second order or high order effects that cannot be simulated by conventional compensating techniques. Elimination of such factors in a manner that does not significantly alter the price of a system enables a substantial increase in performance to be achieved, making a given system competitive with more expensive units without any fundamental system reconstruction or redesign.

The same phenomenon, of an inconstant hysteretic or other non-linear variation, is exhibited in a wide number of systems in which internal components can have a profound effect upon system performance. Just as variations which cannot be measured by practical means are discernible to the ear in a high fidelity audio system, so too do minute variations within a video display or reproducing system have a disturbing effect on image resolution or color fidelity. In addition, low noise signal detectors provide subtly distorted outputs because of internal functional deviations that cannot be compensated by conventional means.

SUMMARY OF THE INVENTION

In accordance with the invention, the signal from a reproducing or detecting system is compensated to correspond much more closely to the ideal signal waveform by the replication of non-linear components that cause signal-induced deviations within the system. A signal passed through or generated by an assemblage of non-linear elements is fed into a system comprising a high gain amplifier, via an input impedance, in a fashion to derive a difference signal. A feedback circuit from the output of the amplifier is taken through an assembly of replicas of the hysteretic elements and a feedback impedance, such as to compensate the output signal and modify it to the idealized waveform. Alternatively, input signals may be used applied to similar feedback circuits incorporating replicas to induce nonlinearities which precompensate for the characteristics of one or a number of non-linear elements in an assembly.

In audio systems, for example, the magnetic circuit of a magnetic phonograph cartridge, the electrical contacts, the input cable and inherent capacitance of active elements may be compensated by low cost units, resulting in discernible improvements in quality which are generally inversely proportional to the quality of the original units. In like manner, hysteretic and other non-linear elements present in other systems may be compensated in similar fashion, in order to improve the quality of output.

Systems in accordance with the invention may utilize a ferromagnetic replica element which has hysteresis and eddy current characteristics and a physical configuration substantially equivalent to that of the cartridge in which it is used. Around this ferromagnetic element is wrapped a coil. This coil of wire with its ferromagnetic core, called the replica, is so designed that when the proper current is passed through the wire in the replica, the flux density within the replica core will duplicate the flux density within the phonograph cartridge body. The replica is used within an electronic circuit in such manner that when a phonograph cartridge is connected to the input of said electronic circuit and activated by playing a record with said phonograph cartridge, the signal voltage generated within the replica circuit will be compared to the playback voltage generated by the phonograph cartridge in such manner that the errors induced in the phonograph cartridge due to the hysteresis, eddy currents and load effects will be cancelled by the equivalent effects induced in the replica. Adjustments are provided in the circuit to allow the circuit with its replica to be used with substantially any magnetic phonograph cartridge which uses a ferromagnetic material euivalent to that used in the replica core. Also included in the circuit are provisions to duplicate and adjust other parameters of the elctronic circuit including the phonograph cartridge together with its input cable that is used in the invention.

Thus, any interaction between the distortion effects in the phonograph cartridge and the cables between the phonograph cartridge and the invention will be substantially cancelled out in the invention. The user is free to use any length and any design of cable that is convenient. Simple adjustments on the invention will compensate the electronic circuits to match the variation in length and design of electronic cable used in the invention.

Further in accordance with the invention, compensating circuits are provided that may be utilized with magnetic phonograph cratridges of a range of different characteristics. In accordance with other aspects of the invention, compensation for the inconstant deviations induced by system contacts, when incorporated in the feedback circuit, provide a substantially more universal solution to the problem. Furthermore, the feedback circuits may also include capacitive elements which compensate for the inherent capacitance of the active elements used in the amplifier circuitry. This reprocessing of the reproduced signals, with elimination of unwanted variations by the use of replications, may be further augmented by the use of a replica of printed circuit wiring. All of the replications may be readily implemented inasmuch as the simple equivalents, or equivalents of only part of a device, may suffice for purposes of duplicating the non-linear effect.

BRIEF DESCRIPTION OF THE DRAWINGS

A better understanding of the invention may be had by reference to the following description, taken in conjunction with the accompanying drawings, in which:

FIG. 1 is a block diagram of a system in accordance with the invention for eliminating higher order signal-dependent nonlinearities introduced by components or devices;

FIG. 2 is a block diagram of a variation of the system of FIG. 1, arranged to precompensate for signal-dependent nonlinearities;

FIG. 3 is a graph showing the variation of magnetic driving forces in a typical ferromagnetic material and illustrating hysteresis losses for two different values of magnetic flux density;

FIG. 4 is a simplified perspective view, partially broken away, of a magnetic replica device that may be used in systems in accordance with the invention;

FIG. 5 is a graph showing the signal dependent variation of charge Q with respect to voltage V in a typical capacitor;

FIG. 6 is a schematic representation of the equivalent circuit for a capacitive device;

FIG. 7 is a graph of resistance variations of a circuit contact, in response to self-heating under applied signals;

FIG. 8 is a graph of resistance variations of a circuit contact in response to tunneling effects arising from film on the contacts;

FIG. 9 is a perspective view of a series of contacts that may be used as a replica for contacts in a system;

FIG. 10 is a simplified perspective view of a suitable replica for a typical printed circuit board;

FIG. 11 is a graphical depiction of a typical audio signal waveform with and without compensation for eddy current effects;

FIG. 12 is a schematic circuit of a system in accordance with the invention for compensating for non-linear effects arising from magnetic hysteresis, input cable nonlinearities and eddy current effects;

FIG. 13 is an alternative circuit configuration for a system for compensating nonlinearities in audio systems incorporating a magnetic phonograph cartridge;

FIG. 14 is a combined block and schematic diagram of a second alternative circuit for compensating nonlinearities in a sound reproducing system;

FIG. 15 is a combined block and schematic diagram of a circuit arrangement for compensating nonlinearities in a radiation responsive detector system;

FIG. 16 is an equivalent circuit for a photodiode that may be used in the system of FIG. 15; and FIG. 17 is a graph of current vs. voltage characteristics for a typical photodiode such as may be used in the system of FIG. 15.

DETAILED DESCRIPTION OF THE INVENTION

The effect of nonlinearities in signal processing, particularly in the presence of complex multifrequency signal waveforms, is to generate harmonics and intermodulation products which are not in the original signal waveforms. In modern electronic circuit design, the gross nonlinearities of the active elements used are well understood and are compensated by well known circuit techniques typically involving negative feedback of an overall or local type. However, in some applications, such as high quality audio reproduction, differences readily perceptible to the human ear are detectable between devices (e.g., preamplifiers and amplifiers) for which the differences in performance characteristics are immeasurable, using state of the art instrumentation equipment. This leads one to suspect that effects are involved which heretofore have either been overlooked, considered unimportant, or are correctable only at inordinate expense at the component level.

Experimental evidence indicates that these higher order effects occur both in elements associated with the signal path (capacitors, switch connector contacts wiring, etc.) and with source signal transducers (such as phonograph cartridges, infrared radiation transducers, visible radiation transducers, sonar transducers, etc.). The inherent nature of some electrical and transducer elements involves signal induced inconstant variations in one or several of the element characteristics. These variations include phenomena such as hysteresis in which the instantaneous dynamic characteristic of the element depends on the state of the signal or exciting force in prior time. There is also the non-hysteretic simple nonlinearity in which the instantaneous characteristics depend only on the instantaneous signal or exciting force. The higher order effects which are present and correlate with experiments in the audio field are inherent in most of the components and transducers and can be at best only diminished to a low but still perceptible value; this reduction is achieved usually with disproportionately increasing cost. In some instances, no matter what the cost, perfection in the sense of absence of disturbing effects is theoretically unachievable because perfect components are also unachievable.

However, by use of the techniques described herein, it is possible to correct for the inherent immeasurably small phenomena in many of the elements. The advantage of concepts in accordance with the invention is that by accepting the available imperfect elements as they are, it is possible to configure a system which approaches perfection and also allows the use of less expensive elements which may exhibit undesirable phenomena to a greater degree than more expensive elements.

The system shown in FIG. 1 is illustrative of the general case in which a source of signal 10 provides an input waveform which is to be precisely duplicated at an output terminal. The signal source 10 is characterized as providing a complex multifrequency wave, because this is the usual condition under which nonlinearities will introduce perceptibly disturbing effects. Reconstitution of a simple mono-frequency wave is usually regarded as trivial in the present state of the art, but the principles of the invention may also be applied to this problem where a degree of precision may be required that is unattainable because of component or device limitations. The signal from the source 10 is thereupon to be processed by some system, such as a preamplifier-amplifier chain, comprising an assembly 12 of non-linear elements, such as those of the classes described hereinafter. The fidelity of the input signal is thereby diminished because of the nonlinear, signal induced, deviations arising at various points in the processor 14. The assembly may be characterized as having an impedance $Z_s$, and the processor also may be characterized as defining an input impedance 16, whose value may be characterized as $Z_{in}$. The thus processed signal wave is applied to one input of a differential amplifier 18, the output from which is coupled to the output terminal 20 for the system, but which is also connected into a feedback path incorporating an assembly 22 of replica non-linear elements corresponding in physical nature at least to that portion of the non-linear elements in the processor that induce perceptible nonlinearities in the signal. In the system as a whole, these replica elements may be regarded as passive elements because they operate subsequent to signal processing, and shadow elements because they create a perceptible image of a certain portion only of the functions performed during processing. The assembly may be characterized as having an impedance $Z_f$, and the feedback signal is applied to the negative input of the differential amplifier 18 through a feedback impedance 24 which may be characterized as $Z_{in}'$. The differential amplifier 18 functions with high open loop gain, of the order of 1000 or greater, and a condition of high input impedance on the order of 1 megohm or greater. Further in accordance with the invention, the amplifier gain $A_v$ may be characterized as follows:

$$A_v = \frac{E_0}{E_i} = K \frac{Z_f \times Z_{in}'}{Z_s \times Z_{in}} \qquad \text{Equation (1)}$$

Under these conditions, the differential amplifier 18 tends to attempt to force the signals at the positive and negative inputs to become identical, within a factor of the reciprocal of the open loop gain; thus, if the open loop gain is 1000, the signals will be equal to within a factor of 0.001. The signal in the feedback path, however, is distorted by the replica assembly 22 and the feedback signal stabilizes when the output signal from the differential amplifier has been returned to the idealized waveform, so that the nonlinearities induced in the idealized waveform (corresponding to the signal from the source 10) has been nonlinearized by the replica assembly 22 in the same fashion as the input signal was nonlinearized by the assembly 12 within the processor 14. Therefore, by making the assembly of non-linear elements in the feedback path such that they accurately represent and produce the undesirable effect present in the input signal path, the amplifier output signal $E_0$ at the terminal 20 is identically proportionate to the original signal E. The undesired effect is also reduced in magnitude by a factor equal to the open loop gain. It should be borne in mind that we are dealing here with higher order perturbations in the processed signal whose amplitudes and dynamic character prohibit compensation by conventional passive or active network techniques. Recreation of these minor signal deviations in the present system does not introduce concomitant variations of different kinds, or secondary problems, because the feedback loop including the differential amplifier is, in the present state of the art, a non-degrading signal repeater. A differential amplifier need not be employed as the high gain amplifier in the feedback loop inasmuch as a summing network may be used to provide a difference input to an amplifier, as shown below.

Further in accordance with the invention, as shown in FIG. 2, a system may be utilized in a complementary fashion to precompensate a signal before it is passed through a subsequent processor containing non-linear elements. As shown in FIG. 2, a differential amplifier 18' is coupled to receive an input signal $E_{in}$ at its positive terminal, and provide an output signal $E_0$, which is fed back to the negative input through an assembly of replica non-linear elements 22' and a feedback impedance 24'. Again, the forced action of the differential amplifier 18, seeks identity between the positive and negative inputs, which is achieved when the non-linear deviations are generated in the output signal, and counteracted by the assembly 22 of replica non-linear elements. When this precompensated signal is applied to the subsequent processor 25 and the assembly 26 of non-linear elements contained therein, the modified applied signal $E_0$, transferred through the input impedance 27 becomes the idealized waveform proportionate to $E_{in}$. Thus the system of FIG. 2 preconditions the input signal to anticipate the undesirable higher order non-linear effects which are known to exist in the signal processor. The major difference from the arrangement of FIG. 1 is that the output signal from the differential amplifier 18' is distorted and altered in such a way as to be the inverse of the later arising non-linear effects in the signal path.

As shown in both FIGS. 1 and 2, the signal induced effects which are under consideration can generally be represented as a complex impedance. This complex impedance is in turn actually a set of impedances which include ideally linear elements in combination with non-linear elements. The mathematical representations of the cancellation effect are accurate since replication techniques under consideration preserve the relationships expressed mathematically. In particular, the ratios of impedance and magnitudes of nonlinearities are preserved between the feed-forward and feedback paths.

Referring to FIG. 3, nonlinear hysteresis effects arise from the inherent nature of such materials and are of sufficient magnitude in quality sound systems to be discernible by a moderately perceptive listener. When the flux density in a ferromagnetic material is changed from a value A to a different value B and then back to value A again, one finds that the magnetic forces needed to change flux density from A to B is different than the forces needed to change the flux density back from B to A. There is a loss of energy that takes place in the complete cycle of change from A to B and back to A again. This fact has been well known and is common to all ferromagnetic materials. There is no material yet discovered displaying both ferromagnetism and non-existent hysteresis loss. The loss undergone within the ferromagnetic material during changes of flux density is highly nonlinear. That is, if one changes flux density over a distance from A to B and back to A again, and measures the loss, then changes the flux density from A to C and back to A again and measures the second loss, the relation between the loss in the second case and the loss in the first case would probably not have any relationship to the differences in flux between A and B or difference in flux density between A and C. As the ferromagnetic material is driven closer to saturation, which is that level of magnetic flux density which is the maximum which can be impressed in the ferromagnetic material, the hysteresis loss will increase by amounts which are much larger than the amounts by which the magnetic flux density is increased. The hysteresis effect will cause a distortion of the voltage signal generated by the mechanical motion of the magnetic cartridge elements. As the flux is increased from its nominal level to a higher level, the voltage will not be as high as it should be and as the flux is decreased from the maximum value to its nominal value, the voltage in general will be higher than it should be if the voltage were to follow the mechanical velocity of the moving magnetic materials exactly.

In accordance with the invention, the magnetic cartridge is modeled by a replica cartridge. This replica cartridge is formed by wrapping a coil 30 of wire around a core material 32 as shown in FIG. 4. The replica has substantially the same magnetic and eddy current characteristics as the cartridge from which the input signal is derived. The number of turns is dependent on the particular circuit used. In the actual cartridge, there is a constant non-zero flux present at all times. This puts the operating point on the B-H hysteresis curve at some point offset from zero. This effect can be duplicated by adding an additional coil 34 to the core as a bias winding and flowing current through it from a high impedance source. This DC magnetomotive force will provide a DC offset flux density.

Conventional variable flux magnetic cartridges are constructed using a variety of magnetic materials to form the "core" of the magnetic circuit through which the magnetic flux passes. In virtually all of these cartridges the core is formed by a solid structure of high permeability material. This type of construction can give rise to another phenomenon due to eddy currents in the core material, particularly if the material has significant electrical conductivity.

Evidence of the phenomenon arises in looking at the electrical impedance of a magnetic structure constructed with such material. At higher frequencies it is seen that the inductive portion of the impedance appears to decrease with increasing frequency and the resistive portion tends to increase with increasing frequency. The inductance L and incremental resistance $\Delta R$ can be characterized by the equations (as described in Chapter 17, *Ferromagnetism* by Bozorth, published by Van Nostrand, 1951):

$$\frac{L}{L_o} = \frac{1}{2\pi d \left(\frac{uf}{p}\right)^{\frac{1}{2}}} \qquad \text{Equation (2)}$$

where
$L_o$ = Low frequency inductance
d = Material thickness
u = Permability
p = Resistivity
f = Frequency. and $$R = \frac{L_o(f)^{\frac{1}{2}}}{d\left(\frac{u}{p}\right)^{\frac{1}{2}}} \qquad \text{Equation (3)}$$

The dependence in each case on $(f)^{\frac{1}{2}}$ gives an impedance characteristic that varies with frequency at 3 dB per octave instead of the conventional 6 dB per octave.

The phenomenon, when present, exhibits itself in that a delayed signal follows slightly behind any main signal present in the circuit as shown in FIG. 11. In a circuit which does not exhibit the 3 dB per octave characteristic the output signal may be spread out (compared to the input signal) due to non-infinite frequency response, but there is no "wake" of signal following along behind as represented in FIG. 11 (from page 150 of Vibration and Sound, by Philip Morse, First Edition, published by McGraw-Hill, New York, 1963). It is also significant to note the fact that the conventional phonograph cartridge has a coil of wire wrapped around a magnetic core gives the cartridge a source impedance. This source impedance can affect the signal reproduction capability particularly if the connecting cable or the preamp input seriously load the cartridge source impedance.

The capacitors used in all electronic equipment display the nonlinear effect of dielectric absorption to a variable degree depending upon the dielectric medium used. The characteristics of most dielectrics are such as to simulate to a first approximation a capacitance in series with a comparatively small resistance. The charge on the capacitor does not attain its maximum value the instant a potential is applied, but the charging current may be appreciable over a period of minutes. Likewise, the charge does not flow off instantaneously when the terminals are shorted; there is a certain time lag associated with the dielectric which gives rise to a hysteresis phenomenon. If the instantaneous value of the charge is plotted for a complete period as a function of the voltage across the capacitance as in FIG. 5, the path is not the same going from point A to point B as going from point B to point A. The area within the curved path represents the energy dissipated in the dielectric in one cycle. The approximate equivalent circuit is shown in FIG. 6. The effective series resistance $R_s$ decreases with frequency in such a way that the product $R\omega C$ remains essentially constant over a very large range of the variable $\omega$ ($\omega = 2\pi \times$ frequency). (Reference: Gaylord P. Harnwell, *Principles of Electricity and Magnetism*, 2nd Edition, McGraw-Hill Book Company, Inc., New York, N.Y., 1949). The nonlinear effect of the frequency variable series resistance causes intermodulation products in complex waveforms with multi-frequency content, and can be distinguished in audiophile quality sound reproduction equipment.

For capacitors which are commercially available, the stated ranges of equivalent series resistance (at self resonance) vary over several orders of magnitude. For instance, tantalum electrolytic capacitors have an equivalent series resistance on the order of 500 milliohms while aluminum electrolytic and film electrolytic (such as polypropylene or polystyrene) capacitors have equivalent series resistances on the order of 50 and 5 milliohms respectively. In audio listening tests, there is a correlation between better fidelity of reproduction with lower equivalent series resistance; cost also increases significantly with lower equivalent series resistance. Yet in the tests conducted, the circuit impedances were generally high (on the order of 50,000 ohms); thus the variations encountered are on the order of 1 part per million and are virtually immeasurable with standard test equipment. There are other elements in electronic systems which are affected by dielectric effects; these include wire, cabling, printed circuitry and the like, all of which use insulating media with dielectric effects. Although more complex structurally, all such elements may be replicated by use of an identical device or devices. It is typically satisfactory to use a single capacitive element proportioned to provide a net non-linear effect for each class of circuit devices, such as circuit capacitors, cabling, and the inherent capacitance of transistor junctions.

Another effect which is generally considered to be negligible is the contact resistance of connectors, switches and potentiometers. There are however a number of physical processes associated with mechanical contacts which demonstrate non-constant parameters and which cause discernible distortion in audio systems.

One of the phenomena is the nonlinearity of the contact resistance due to self-heating within the contact. Even though a switch may appear to have a large conducting area, the conducting area in truth is a collection of microscopically small contact points generally consisting in number from as few as three (three points define a plane) to many more depending upon the plastic deformation at the contact surfaces. Data shows that the resistance in the contact area is nonlinear with current through or voltage across the contacts (R. Holm, *Electric Contacts Handbook*, Springer Verlag, Berlin 1958). This characteristic is shown in FIG. 7.

There is yet another effect in dealing with contacts which is more prevalent in actual practice. This is the tunnel effect due to film layers between contact surfaces. These film layers can occur from lubricating substances, debris, or more generally from insulating oxide layers as a result of the metal surfaces being in contact with the air. The tunnel effect (described in detail in R. Holm, *Electric Contacts Handbook*, Springer Verlag, Berlin 1958) yields a contact resistance which is again nonlinear with current through the contact or the voltage across the contact as shown in FIG. 8. The order of magnitude of the contact resistance in a conventional switch is on the order of a few milliohms to a few hundred milliohms. This of course, when viewed in light of high impedance circuits, makes the variations again down in the immeasurable range.

An assembly of contacts for use in the replica circuit is shown in FIG. 9. The form of contact shown is a set of dieformed pieces 33 of hardened brass which have been tin plated prior to forming. The assembly is made by stacking the desired number of contacts 33 in series and then shrinking thermoplastic sleeving 35 over the stack as shown. The endmost pieces are used as the solder points for connecting the assembly into the circuit.

A technique for use in replicating the effect of printed circuit wiring is shown in FIG. 10. It involves placing a conductor 36 (generally copper) path back and forth across the surface of one side of a dielectric sheet 37 (generally epoxyglass or fiber base phenolic material). The other side can be completely covered to form a ground plane if this more accurately simulates the condition being replicated. The length of conductor and thickness of the dielectric depends again on the configuration being replicated.

In accordance with the invention, referring now to FIG. 12, a circuit is shown which employs electrical replicas to cancel any distorting effects which relate to hysteresis, eddy currents or impedance loading.

The circuit of FIG. 12 will form a signal voltage at the amplifier 38 which will be substantially proportional to the mechanical motion within a cartridge 40 which generated the playback signal at the cartridge output. The signal generation mechanism within the cartridge 40 is defined by $$e = AN\frac{d\phi}{dt} \qquad \text{Equation (4)}$$

where
  e = signal voltage
  A = a constant
  N = the number of turns in the coil
  $\phi$ = the flux passing within the coil
  d/dt = the derivative with respect to time.

The flux change within the coil in the case of the magnetic cartridge is caused by the mechanical motion of stylus within the cartridge. This mechanical motion can be equated to an equivalent variable magnetomotive force since $$\phi = \frac{NI}{R} \qquad \text{Equation (5)}$$

where
  N = number of turns
  I = current
  R = magnetic circuit reluctance.

Thus, defining the reluctance R as essentially constant it can be said that the variable flux $\phi$ can be defined as proportional to a variable magnetomotive force NI.

The playback signal from the cartridge 40 at the input of the circuit of FIG. 12 passes through an input cable 42 and appears across an input capacitance 44. This signal is compared with an adjusted test voltage signal that appears across a capacitor 46 in the feedback loop from a second amplifier 48. The feedback signal is inverted in the second amplifier 48, being applied to the negative (−) input, so that it may be subtractively combined with the input signal at the positive (+) input to the first amplifier 38, the negative input of which is coupled to ground or a reference. This circuit therefore also responds to the difference between the signals in such a way as to provide an idealized output waveform. Note that the adjusted test voltage signal across capacitor 46 has passed through a replica cable 50 and a replica (X1) impedance 52. The replica cable 50 can be a more or less accurate model (from a simple capacitance to actually including a length of cable in the circuit) of the input cable 42. The replica impedance 52 is a duplicate of the cartridge impedance ($X_c$) designated as 54. Thus the adjusted test voltage signal across the capacitance 46 has been acted upon by circuit elements corresponding to those affecting the cartridge 40 playback signal as it is applied across the input capacitance 44.

Note that the second amplifier 48 which generates that test voltage has a replica cartridge 56 in its feedback circuit. The feedback action in this circuit causes the current in a resistor 58 between the amplifiers 38, 48 to be equal (since we can assume essentially infinite gain and input impedance in amplifier 48) to the test current in the cartridge replica 56.

The voltage across the cartridge replica 56 is defined by $$e_2 = A_2 N_2 \frac{d\phi}{dt} \qquad \text{Equation (6)}$$

where
- $e_2$ = voltage across L1
- $A_2$ = a constant
- $N_2$ = the turns in coil L1
- $\phi$ = the flux within the coil
- $d/dt$ = the derivative with respect to time.

The flux in this case can also be related to a magnetomotive force $$\phi = \frac{N_2 I}{R_2} \qquad \text{Equation (7)}$$

where
- $N_2$ = the turns in the coil
- $R_2$ = the magnetic circuit reluctance
- $I$ = the test current in the coil.

Thus the signal voltage at the amplifier 38 is converted to a current through resistor 58 (since the inverting input of the second amplifier 48 is a virtual ground). This is then the test current which drives the cartridge replica 56. Thus the signal voltage from the first amplifier 38 (a high gain device) is directly proportional to a magnetomotive force and can be assumed proportional to the original motion in the cartridge since the magnetomotive force in the cartridge replica 56 can be adjusted in the circuit such that the cartridge replica 56 operates on the same B-H curve as does the cartridge. This signal will be substantially free of the effects of hysteresis and eddy currents since these same effects exist in the replica 56. The effects of impedance are accounted for in the feedback path by the X1 impedance 52, capacitance 46 and the cable replica 50. An offset flux density can be set into the cartridge replica 56 by addition of a voltage bias 57 to a winding of the replica 56.

A potentiometer 66 in series with the second amplifier 48 output can be varied to vary the signal drive level applied to the cartridge replica 56. This allows the flux density in the replica to be adjusted to match that in the cartridge 40.

In general, most of the phonograph cartridges commercially available have a series resistance of about 700 ohms. The inductance of the cartridges falls into two ranges depending on the method used to vary the flux: the moving iron (variable reluctance) cartridges generally have fairly low inductance on the order of 50 millihenrys and the moving magnet cartridges have inductance about an order of magnitude larger. The magnetic core material is generally a high permeability material such as ultrapure iron or a commercial alloy such as Hy-Mu 80.

These variations in cartridge construction can be accommodated by allowing for adjustments in the circuit. The variation in inductance can be compensated by using a variable or tapped inductance in the X1 impedance 52. Any variation in winding resistance can be accounted for by using a variable resistance in the impedance 52.

The variation in core material can be accounted for, at least to some degree, by varying the drive level of signal current in the cartridge replica 56. This can be accomplished using the potentiometer 66.

Another variation encountered in system connections is the various type of cables and length used in connecting the cartridge to the circuit. The cable can generally be dealt with by assuming that it is a lumped-constant capacitance (a generally good assumption at audio signal frequencies for the short lengths of cable used). Thus, the cable variations can be handled by using a variable capacitance within the cable replica 50.

Also shown in FIG. 12 are waveforms at various points in the circuit. Within the cartridge 40, the stylus displacement is shown as a non-distorted sinusoidal waveform. The signal voltage at a source or generator 60 within the cartridge 40 is shown as a distorted sinusoidal waveform. Within the circuit, the test voltage waveform at the output of the second amplifier 48 has the same distortion as the playback signal voltage generated within the cartridge 40. The waveform at the output of the first amplifier 38 has the same undistorted character as the original stylus motion within the cartridge 40.

In order to achieve a signal appropriate for use as an output from this system, the signal from the first amplifier 38 must be differentiated with respect to time (as is done in the cartridge originally). This is accomplished in the circuit around a third amplifier 62 that receives the output signal from the first amplifier 38. The equation defining the voltage transfer function of this circuit is given by $$\frac{E_{out}}{E_{in}} = -\frac{1}{R_6 C_3} \frac{1}{S} \qquad \text{Equation (8)}$$

In Laplace transform operator notation. The inverse transform of this equation is:

$$e_{out} = \frac{1}{R_6 C_3} \frac{d(e_{in})}{dt} \qquad \text{Equation (9)}$$

as is desired. Without this differentiation, the signal from the first amplifier 38 would have a frequency response which varies with increasing frequency at a negative 6 dB per octave.

If one wishes to incorporate the standard RIAA compensation (normally included in all commercial preamplifiers) in this system, it can be accomplished by modifying the circuit around the third amplifier 62 to include a frequency shelving network as shown around a fourth high gain amplifier 64 which also receives the output signal from the first amplifier 38.

The network around the high gain amplifier 64 forms what is known as a frequency shelving network. This means that over the range of frequencies below a certain frequency the circuit gain is one value and that over the range of frequencies above a certain frequency the circuit gain is another value. This is also evident by examining the circuit in some detail. At low frequencies an input coupling capacitance 68 is effectively very large compared to a parallel input resistance 70 and the circuit gain is given by $$A = -\frac{R9}{R7 + R8} \qquad \text{Equation (10)}$$

where
A = gain
R7, 8, 9 = circuit resistances.

At high frequencies, the capacitance 68 is small compared to the resistance 70 and essentially shorts it out. In this case the circuit gain is given by $$A = -\frac{R9}{R7} \qquad \text{Equation (11)}$$

In the circuit of FIG. 13, it is assumed that the signal from the cartridge is generated from a linear source and is caused to be nonlinear and exhibit eddy current effects due to passing through an impedance which has the distorting charac- teristics.

In FIG. 13, the cartridge 86 is shown in a form which has a voltage generator 88 in series with an impedance 90 which includes the cartridge inductance 87 in series with the coil winding resistance 89. The input impedance 92 of the circuit includes the impedance of the input cable 91 and the input resistance 93 in parallel with the input capacitance 95.

The feedback circuit includes the replica impedance 94 comprised of the inductance 84 and the series resistance 102. The signal from the replica impedance 94 passes to the feedback impedance 96. This circuit has the same form as the input impedance 92 and is made up of a cable replica 98 in parallel with a potentiometer resistance 82 and a capacitance 100. The purpose of the potentiometer 82 is to allow the gain of the circuit to be adjusted.

The equation which defines the circuit operation predicated upon high open loop gain in the amplifier 80 can be summarized as follows:

$$\frac{E_{out}}{E_{in}} = K \frac{\frac{Z_{in}}{Z_c + Z_{in}}}{\frac{Z_f}{Z_R + Z_f}} \qquad \text{Equation (12)}$$

where (with all quantities stated in Laplace operator notation in the s-plane)

$Z_c$ = the cartridge impedance 90 including the inductance 87 and series resistance 89

$Z_{in}$ = the impedance combination 92 of cable, input resistance 93 and input capacitance 95

$Z_f$ = the impedance combination 96 of the replica 98, resistance 82 and capacitance 100

$Z_R$ = the impedance 94 of the replica cartridge 84 including the series resistance 102

K = a constant.

In this case, if the impedance loading effects are to be removed, the input and feedback impedance ratios must remain equal $$\frac{Z_c}{Z_{in}} = \frac{Z_R}{Z_F} \qquad \text{Equation (13)}$$

Note that the overall gain of the circuit is adjustable by the potentiometer 82. This allows the signal level across the replica 84 to be adjusted so that it operates on the same B-H curve as the cartridge 86. Thus the effects of hysteresis, eddy currents and impedance loading are cancelled by the feedback in the circuit. An offset flux density can be set into the replica by addition of a voltage bias 97.

Also shown in FIG. 13 are representative waveforms at various points within the circuit. The waveform at the cartridge generator 88 is shown as an undistorted sinusoid.

The signal from the cartridge 86 is shown as a distorted sinusoid as is the test signal from the replica 84. The signal at the output of the high gain amplifier 80 is a sinusoid free of the effects of distortion.

The circuit of FIG. 14 is similar in some respects to the circuit shown in FIG. 13 and similar numbers are used where like functions are performed. The circuit also, however, includes means to account for and cancel the effects of capacitance, contact nonlinearity, and printed circuit wiring.

As shown in FIG. 14, mechanical contacts 110, 111 are connected in series with the cartridge 40 and any cabling, as previously described in connection with FIG. 9, while a set of replica contacts 112 is disposed in the feedback loop. The number used in the replica set 112 is dependent on the number of actual mechanical contacts 110, 111 used in system both preceding the circuit and after the circuit and to an extent the signal level and impedances associated with the circuit in which the contact is located. These mechanical contacts are generally formed by some type of connecting device, as shown in FIG. 9. In one of the circuits fabricated in accordance with the invention, the contact replica 112 used was 13 contacts connected in series. This was to compensate a system wherein there were four mechanical contacts, all slip-together connectors. The quantity of contacts used in the replica depends on the mechanical configuration of both the contacts being compensated, the configuration of the replica contacts, and the impedances in the circuits. The significance of the impedance shows up in the contacts due to the current which is flowing through the contacts. Tests show the effects of contacts tend to diminish with higher circuit impedance and lower current.

The input signal is applied to the positive input of the amplifier via a generalized input impedance $Z_{in}$ 113 and a coupling capacitor 114, and the impedance $Z_f$ 116 for the feedback path is also shown in generalized form. Also shown in FIG. 14 is the technique used to compensate for the dielectric effects in coupling capacitors in the processing circuits. The compensation technique utilizes R-C couplings such as the shunt R1 resistor 116 and series C1 capacitor 117 in the feedback path. Specifically this example shows a further R-C coupling comprising $C_n$ capacitor 118 and $R_n$ resistor 119 as well. The valves of resistance and capacitance used depend upon several considerations. It is desirable to have the R-C product at a value comparable to that which is being compensated. It is also desirable to preserve the ratio of signal voltage to dielectric breakdown voltage in each case for which compensation is being effected. If several couplings are being replicated in series, as shown, it is desirable to maintain circuit impedances which are everincreasing to minimize loading effects (i.e. $R_n > R_{n1} > R_1$). The maximum number of couplings used in the feedback loop will be affected by loop stability considerations.

A printed circuit wiring replica 120 is also shown in FIG. 14. The amount of wiring track in a typical printed circuit board for use in an audio device is on the order of 12 to 24 inches. The replica used in the experimental tests had a total track length of 36 inches available but was cut to use only 18 inches of track length. The configuration of the replica 120 may be as is described in conjunction with FIG. 10. Even though not exhibiting the intricate, more finely resolved, pattern of a printed circuit board (although a precise duplicate may be used if desired) the overall effect is adequately similar.

Another example of a transducer system which can benefit from the use of correction from signal induced variations is the photon transducer system shown in FIG. 15. As depicted in FIG. 15, photons of radiation are collected at the junction of a photodiode 130 at the input to the circuit in response to some external stimulus. The electron current generated in the junction of the photodiode 130 passes through a feedback resistor 132 around a first amplifier 133 functioning as a preamplifier to increase the signal amplitude for further processing. The output signal from the first amplifier 133 passes on to a second, differential, amplifier 135. The output signal voltage from the second amplifier 135 is impressed across the series combination of an output resistor 137 and a light emitter diode 138. The light emitter diode 138 radiates photons proportional to the current flowing across its junction from the output resistor 137. A replica photodiode detector 140 is juxtaposed to be energized by the light from the emitter diode 138. Note that if the characteristics (current vs. diode junction voltage, junction resistance, junction capacitance, etc.) of the two detectors are similar, the two detectors 130, 140 need not operate at the same radiation wavelength. For instance the input detector 130 may be sensitive to infrared radiation in the radiation wavelength band from 3 to 5 micrometers while the replica detector 140 may be sensitive to visible radiation at a wavelength of 0.6 micrometers. The feedback loop from the output of the second amplifier 135 is completed by a third amplifier 142 that is configured as a preamplifier to be similar to the first amplifier 133. The signal from the third amplifier 142 is compared to the signal from the first amplifier 133 in the differential amplifier 135. If open loop gain $A_{OL}$ is on the order of 1000 then the two signals at the input will be equal to a factor of $(A_{OL})^{-1}$ or about 0.1 percent.

The input resistance of the first stage as seen by the photodiode 130 is $$Rin = \frac{R1}{A_{OL}} \quad \text{Equation (14)}$$

where $A_{OL}$ is the open loop gain of the amplifier and $R_1$ is the value of the feedback resistor 132. In typical applications, R1 is of the order of 10 to 20 megohmns and $A_{OL}$ is of the order of 1000 over the frequency range of interest, generally to 20 kilohertz. Thus the input resistance will be on the order of 10 to 20 kilohms.

The equivalent circuit for a photodiode or photon detector 130 as used in this explanation is depicted in FIG. 16. The transduction process is one of converting photons of radiation into free carrier electrons in the junction of the diode, which appears as a generator 145 shunted by a resistor 146 and a capacitor 147. In the case of a photon detector operating in 3 to 5 micrometer wavelength band, the steady state current in the current generator 145 is on the order of a few nonoamperes, the parallel resistance 146 is on the order of 1 megohm, and the parallel capacitance 147 is on the order of a few picoforads.

The junction characteristics of a typical photodiode photon detector are shown in FIG. 17 (derived from Hudson, Infrared Systems, Wiley & Sons, 1969), with current variations plotted against voltage. Short circuit current conditions exist at points B and C (where the voltage across the junction is zero). Point C is the zero current condition corresponding to zero photons arriving at the junction and B corresponds to some equiescent level of transduction. As is evidenced by the curves in FIG. 17, the junction resistance (the slope of the curve) is dependent on the junction voltage. Since the junction current from the diode is not going into a true short circuit in the preamp stage (the first amplifier in FIG. 15), the signal current will modulate the junction voltage and hence the junction resistance. The junction capacitance is also a function of the junction voltage; it tends to decrease as the junction voltage increases. Thus the signal current into a finite resistance will modulate the junction capacitance.

Thus, the junction impedance of the detector 130 is subject to signal induced variations which will cause non-ideal signal output in the presence of complex photon arrival waveforms. Because of modulation in the presence of the complex waveforms, the output signal will contain harmonic and intermodulation products in addition to the signal proportional to the photon input. These products are on the order of 60 dB below the signal of interest. By use of the exemplification shown in FIG. 15 they can be reduced another 60 dB. This reduction is significant in the case of high resolution, high quality imaging system applications. It is also significant in systems which use these photon detectors to transduce information from laser beams used in communication systems.

Although a number of variations and modifications have been described, it will be appreciated that the invention is not limited thereto but encompasses all forms and exemplifications within the scope of the appended claims.

What is claimed is:

1. A system for compensating for substantially immeasurable signal deviations introduced in a complex multifrequency waveform by a unit including electrical devices having internal signal dependent nonlinearities that introduce second order deviations, the system operating independently of phase and frequency properties of the waveform and comprising:

high gain amplifier means coupled to receive the complex multifrequency waveform and providing an output signal responsive thereto; and signal modifying means including passive replica means in the form of electrical device which replicate the signal dependent nonlinearities introduced by at least one of the electrical dependent nonlinearities introduced by at least one of the electrical devices of the unit and coupled to receive the output signal to introduce corresponding immeasurable signal dependent nonlinearities therein, the thus-modified signal being coupled to the amplifier means in a sense and amplitude to compensate the signal deviations arising from the nonlinearities of the unit electrical devices in the output signal of the amplifier means without modifying phase or frequency characteristics of the complex multifrequency waveform.

2. The invention as set forth in claim 1 above, wherein the signal modifying means comprises a feedback circuit coupled to the amplifier means.

3. The invention as set forth in claim 2 above, wherein the electrical device that gives rise to the unwanted signal dependent nonlinearities precedes the compensating system and the amplifier means restores the waveform to a form in which the deviation are minimized.

4. The invention as set forth in claim 2 above, wherein the electrical device follows the system and the amplifier means precompensates the waveform introducing deviations which are substantially nullified when the waveform is passed through the unit.

5. The invention as set forth in claim 2 above, wherein complex multifrequency waveform represents a high fidelity acoustic signal and the passive replica means comprises passive replicas of at least the nonlinearity inducing portions of hysteretic devices compensating for magnetic hysteresis and capacitive hysteresis and are coupled in series in the feedback circuit.

6. The invention as set forth in claim 5 above, wherein the passive replica means further comprise at least one electrical junction device.

7. The invention as set forth in claim 2 above, wherein the passive replica means comprises a photosensitive device.

8. The invention as set forth in claim 2 above, wherein the passive replica means comprise at least one hysteretic device from the class of devices comprising magnetic hysteresis elements, capacitor elements, insulated wires and printed circuit boards.

9. The method of reproducing an adjusted version of a complex multifrequency acoustic signal waveform that has been dynamically distorted by signal induced inconstant variations arising from signal dependent nonlinearities arising from higher order imperfections in at least one electrical device, the signal induced variations being of such complexity and of such low signal amplitude that they are not compensable by combinations of electrical circuit components such as resistors, capacitors and inductors but are audible to the human ear, comprising the steps of:
recreating the signal induced variations by passing the complex multifrequency waveform through a passive replica of the at least one electrical device, said replica having like signal dependent nonlinearities; and
compensating the dynamically distorted complex multifrequency waveform by differentially combining the complex multifrequency waveform with the waveform containing the recreated variations to provide the adjusted version of the waveform in which the signal dependent nonlinearities have been substantially nullified without modifying the phase or frequency characteristics of the waveform.

10. The method as set forth in claim 9 above, wherein the adjusted version is compensated subsequent to the electrical device such as to provide an idealized output waveform.

11. The method as set forth in claim 9 above, wherein the idealized version is compensated prior to the electrical device such as to be precompensated.

12. The method as set forth in claim 7 above, wherein the idealized waveform is reproduced with open loop gain of in excess of about 1000 relative to the complex multifrequency waveform.

13. The method as set forth in claim 12 above, wherein the signal induced variations are of the class comprising non-linear hysteretic effects, non-linear capacitance effects, and non-linear resistance variation characteristics of mechanically joined conductor regions.

14. A system for restoring to closer to ideal form an acoustic multifrequency signal passing through an electronic system which includes components that introduce minor, signal-dependent non-linear deviations in the signal to distort the signal in a manner that is audible to the human ear on reproduction but electrically immeasurable, comprising:
means including a high gain amplifier having one input coupled to receive the signal subject to deviation and another input for receiving a feedback signal, the amplifier having an output for providing a difference signal; and
feedback means coupling the output of the amplifier back to the feedback signal input of the amplifier, the feedback means including replicas of at least two of the deviation introducing elements in series therewith, the replicas responding to the applied waveform by introducing minor, signal-dependent non-linear deviations therein, with the gain of the amplifier being selected such that an idealized waveform is fed through the replicas and distorted thereby for feedback application to the amplifier, such that the output of the amplifier is the waveform restored closer to ideal form and the phase and frequency characteristics of the waveform are unaltered.

15. The invention as set forth in claim 14 above, wherein the components have an impedance $Z_s$, the replicas have an impedance $Z_f$, the amplifier has an input impedance $Z_{in}$ and a feedback impedance $Z_{in}'$, wherein the gain, $A_v$, is equal to:

$$A_v = k \frac{Z_f \cdot Z_{in}'}{Z_s \cdot Z_{in}}$$

and wherein the open loop gain of the amplifier is in excess of about 1000 and the input impedance is in excess of about 1 megohm.

16. The method of deriving, from the playback signal from a sound reproducing device having given phase and frequency characteristics but sound distorting non-linear elements, a signal that corresponds more precisely to input to the sound reproducing device, comprising the steps of:

passing a test current through replicas of the non-linear elements to generate a test voltage that corresponds to the playback signal;

adjusting the test voltage in accordance with impedance characteristics of the sound reproducing device; and combining the adjusted test voltage with the playback signal by comparing the adjusted test voltage to the playback signal and amplifying the difference with a high gain greater than about 1000 to generate the test current so as to derive a corrected output voltage which corresponds more precisely to the input without modification of the phase and frequency characteristics of the playback signal.

17. A system for compensating the playback signal from an audio transducer system to correct for hysteresis, eddy current and impedance loading distortion effects in at least one non-linear element associated with the audio transducer system, which effects reduce the sound quality in a manner that cannot be compensated by combinations of circuit elements comprising:

high gain amplifier means coupled to receive the playback signal, compare it to a feedback signal and amplifying the differential; and means including at least one replica of at least one non-linear element of the audio transducer system, the replica comprising a non-linear element introducing internally generated distortion and being from the class of devices comprising hysteretic, capacitive and resistance elements, said means being responsive to the undistorted output of the amplifier means for generating a feedback signal corresponding to the distorted playback signal, such that the differential signal from the amplifier means constitutes a corrected playback signal in which internally generated distortion is mutually cancelled but the phase and frequency characteristics of the playback signal are unaffected.

18. The invention as set forth in claim 17 above, wherein the at least one replica comprises each of a magnetic element replica, a capacitive element replica, an electrical contact replica, a electrical cable replica and a printed circuit board replica.

19. The invention as set forth in claim 17 above, wherein the high gain amplifier has an open loop gain in excess of about 1000 and has an input impedance of the order of 1 megohm or greater and wherein the means for generating a feedback signal comprises means providing a feedback impedance related to the input impedance.

20. The invention as set forth in claim 17 above, wherein the non-linear element comprises a magnetic phonograph cartridge creating hysteresis effects arising from the magnetic elements associated with the cartridge, high gain amplifier means coupled to receive the playback signal;

and wherein the replica is of the magnectic elements of the cartridge and wherein the output of the amplifier means is a playback output signal that is virtually free of hystereais distortion.

21. The invention as set forth in claim 20 above, wherein the means for generating a feedback signal comprises means for compensating the feedback signal for impedance characterisitcs of the cartridge and the system further includes means responsive to the amplifier means for generating a current carrying signal for the replica.

22. The invention as set forth in claim 21 above, wehrein the system further includes means responsive to the playback output signal for compensating the signal to provide a flat frequency response and wherein the replica is further configured to have the same ratio of inductance to resistance as the cartridge.

23. The invention as set forth in claim 22 above, wherein a cable couples the cartridge to the system, the means for generating a feedback signal includes means for compensating for the impedance characteristics of the cable, and wherein the means for generating a current-varying signal for the replica includes means for varying the level of drive current excitation in the replica.

24. The method of deriving, from the playback signal from a magnetic phonograph cartridge, a signal that corresponeds more precisely to the motion of the stylus of the cartridge comprising the steps of:

passing a test current through a replica of the magnetic elements of the cartridge to generate a test voltage that corresponds to the playback signal and incorporates small signal deviations arising from second order effects in the magnetic elements;

adjusting the test voltage in accordance with impedance characteristics of the phonograph cartridge and associated elements; and combining the adjusted test voltage with the playback signal to derive an output voltage which corresponds to the stylus motions by comparing the adjusted test voltage to the playback signal and amplifying the differential with high gain to generate the test current, to nullify only the small signal deviations arising from the magnetic elements.

25. The method as set forth in claim 24 above, further including the step of differentiating the output voltage to compensate for the variation in flux with frequency of the phonograph cartridge and thereby to provide a flat signal response with respect to frequency.

26. The method as set forth in claim 24 above, further including the step of shaping the frequency response of the signal corresponding to the stylus motion such that the resultant signal has a frequency response corresponding to the RIAA playback frequency response curve.

27. In combination with a magnetic phonograph cartridge having a magnetic core and internal inductance and resistance, a circuit for compensating for signal induced distortion effects arising from non-linear characteristics of the magnetic elements, comprising:

a first high gain amplifier coupled to receive the signal reproduced by the cartridge and providing an output therefrom;

a second high gain amplifier coupled to receive the output of the first amplifier;

replica means corresponding to the magnetic elements of the phonograph cartridge and coupled in a feedback path cross the second amplifier to generate signal induced distortion effects in response to an applied signal; and feedback circuit means for feeding the signal from the second amplifier to the input of the first amplifier in opposed phase relation such that the distortion effects are eliminated without modifying phase or frequency response characteristics.

28. The invention as set forth in claim 27 above, wherein the circuit further comprises means in the feedback circuit for duplicating the internal inductance and resistance of the cartridge, and signal combining means at the input to the first amplifier including adjustable resistor means for additively combining the input signal with the feedback signal in adjustable fashion, and wherein the replica means comprise bias means for imposing a constant magnetic flux on the magnetic elements.

29. The invention as set forth in claim 28 above, wherein the cartridge is coupled by an input cable to the first amplifier and wherein the feedback circuit means further comprise means for duplicating the impedance of the input circuit, and further including adjustable resistor means in the feedback circuit means for adjusting the amplitude of the signal applied to the means for duplicating the internal inductance and resistance of the cartridge.

30. The invention as set forth in claim 27 above, including in addition differentiating means coupled to the output of the first amplifer and shelving circuit means coupled to the output of the first amplifier in order to generwte an output signal frequency response corresponding to the RIAA playback frequency response curve.

* * * * *